United States Patent
Kobayashi et al.

(10) Patent No.: US 10,770,581 B2
(45) Date of Patent: Sep. 8, 2020

(54) SEMICONDUCTOR DEVICE

(71) Applicant: FUJI ELECTRIC CO., LTD., Kawasaki (JP)

(72) Inventors: Yusuke Kobayashi, Nagareyama (JP); Manabu Takei, Shiojiri (JP); Shinsuke Harada, Tsukuba (JP); Naoki Kumagai, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 16/518,345

(22) Filed: Jul. 22, 2019

(65) Prior Publication Data

US 2020/0083368 A1    Mar. 12, 2020

(30) Foreign Application Priority Data

Sep. 11, 2018   (JP) .................. 2018-170107

(51) Int. Cl.
| | |
|---|---|
| *H01L 29/78* | (2006.01) |
| *H01L 29/66* | (2006.01) |
| *H01L 29/16* | (2006.01) |
| *H01L 29/423* | (2006.01) |
| *H01L 29/417* | (2006.01) |
| *H01L 29/47* | (2006.01) |

(52) U.S. Cl.
CPC ...... *H01L 29/7813* (2013.01); *H01L 29/1608* (2013.01); *H01L 29/4236* (2013.01); *H01L 29/66734* (2013.01); *H01L 29/7806* (2013.01); *H01L 29/41766* (2013.01); *H01L 29/42356* (2013.01); *H01L 29/47* (2013.01); *H01L 29/66068* (2013.01); *H01L 29/7812* (2013.01)

(58) Field of Classification Search
None
See application file for complete search history.

(56) References Cited

U.S. PATENT DOCUMENTS

| | | | | |
|---|---|---|---|---|
| 8,704,295 | B1* | 4/2014 | Darwish | ............. H01L 29/7806 257/330 |
| 10,141,410 | B2* | 11/2018 | Shimizu | .................. H01L 29/47 |
| 2017/0200787 | A1 | 7/2017 | Shimizu | |
| 2018/0308975 | A1* | 10/2018 | Ohse | .................... H01L 29/0623 |
| 2020/0020798 | A1* | 1/2020 | Deng | .................. H01L 29/1095 |

FOREIGN PATENT DOCUMENTS

JP      2017-126604 A      7/2017

* cited by examiner

*Primary Examiner* — Minh Loan Tran

(57) ABSTRACT

A first side wall and a second side wall of a trench are each an a-plane having high carrier mobility. Along the first side wall of the trench, a gate insulating film is provided. A gate electrode is provided in the trench, and across the gate insulating film, opposes a portion of a p-type base region between an $n^+$-type source region and an n-type current spreading region. Along the second side wall of the trench, a conductive layer is provided. The conductive layer, at the second side wall of the trench, forms Schottky contacts with a $p^{++}$-type contact region, the p-type base region, and the n-type current spreading region. The trench has a bottom corner portion that is at the second side wall and encompassed by a $p^+$-type region that is provided in the n-type current spreading region so as to be separated from the p-type base region.

6 Claims, 15 Drawing Sheets

SEMICONDUCTOR DEVICE

CROSS REFERENCE TO RELATED APPLICATIONS

This application is based upon and claims the benefit of priority of the prior Japanese Patent Application No. 2018-170107, filed on Sep. 11, 2018, the entire contents of which are incorporated herein by reference.

BACKGROUND

1. Field

The embodiments discussed herein relate to a semiconductor device.

2. Description of Related Art

Conventionally, reduced ON resistance, suppression of forward characteristics degradation, and reduced reverse recovery loss are demanded of power semiconductor devices that use a semiconductor material (hereinafter, wide bandgap semiconductor material) having a bandgap that is wider than a bandgap of silicon (Si). To realize reductions in ON resistance, for example, in a vertical metal oxide semiconductor field effect transistor (MOSFET), a trench gate structure is adopted that facilitates lower ON resistance characteristics structurally as compared to a planar gate structure in which a MOS gate is provided in a flat shape on a front surface of a semiconductor chip.

A trench gate structure is a structure in which a MOS gate is embedded in a trench formed on a front surface side of a semiconductor chip and enables reductions in the ON resistance by shortening cell pitch. A conventional semiconductor device will be described taking, as an example, a case in which silicon carbide (SiC) is used as a wide bandgap semiconductor material. FIG. 14 is a cross-sectional view of a structure of the conventional semiconductor device. The conventional semiconductor device depicted in FIG. 14 is a vertical MOSFET having a trench gate structure in which a gate electrode 109 is provided on a gate insulating film 108 in a trench 107 formed on a front surface side of a semiconductor substrate (semiconductor chip) 130 that contains silicon carbide.

The trench 107 penetrates an $n^+$-type source region 105, a $p^{++}$-type contact region 106, and a p-type base region 104 and reaches an n-type current spreading region 103. The trench 107 has a first side wall 107a where the gate electrode 109 opposes, across the gate insulating film 108, a portion of the p-type base region 104 between the $n^+$-type source region 105 and the n-type current spreading region 103. The trench 107 has a bottom corner portion 107d that is at the first side wall 107a and encompassed by the n-type current spreading region 103. As a result, when the MOSFET is ON, an n-type inversion layer (channel) is formed along the first side wall 107a of the trench 107.

The trench 107 further has a second side wall 107b where the gate electrode 109 opposes only p-type regions (the p-type base region 104, the $p^{++}$-type contact region 106, and a second $p^+$-type region 122), across the gate insulating film 108. The trench 107 has a bottom corner portion 107e that is at the second side wall 107b and encompassed by a $p^+$-type region constituted by a first second $p^+$-type region 121 and the second $p^+$-type region 122 provided from the second side wall 107b of the trench 107 and spanning a portion of a bottom 107c of the trench 107. As a result, when the MOSFET is ON, no channel is formed along the second side wall 107b of the trench 107.

In the conventional MOSFET depicted in FIG. 14, when a front surface of the semiconductor substrate 130 is a carbon face ((000-1) plane, a so-called C-face) or a silicon face ((0001) plane, a so-called Si-face), of a (11-00) plane and a (112-0) plane (so-called m-plane and a-plane) that may constitute a crystal plane of the first and the second walls 107a, 107b of the trench 107, the a-plane having high carrier mobility is set as the crystal plane of the first side wall 107a of the trench 107 that forms a channel. As a result, it becomes possible to realize reductions in the ON resistance. The bottom corner portions 107d, 107e of the trench 107 are boundaries between the bottom 107c and the first and the second walls 107a, 107b of the trench 107. Reference characters 110, 110a are an interlayer insulating film and a contact hole, respectively.

Nonetheless, in the conventional MOSFET depicted in FIG. 14 and described above, when flyback current flows through a parasitic pn diode (body diode) formed in the MOSFET, forward degradation occurs due to forward operation of the parasitic pn diode. The parasitic pn diode is formed by a pn junction between the p-type base region 104, the first and the second $p^+$-type regions 121, 122 and an $n^-$-type drift region 102 and/or a pn junction between the p-type base region 104, the first and the second $p^+$-type regions 121, 122 and the n-type current spreading region 103. Reference numerals 101, 111, and 112 are an $n^+$-type starting substrate ($n^+$-type drain region), a source electrode, and a drain electrode, respectively.

The suppression of forward characteristics degradation and reduced reverse recovery loss may be realized by providing a built-in Schottky barrier diode (SBD) formed on a single semiconductor chip having a MOSFET. FIG. 15 is a cross-sectional view of another example of a structure of a conventional semiconductor device. The conventional MOSFET depicted in FIG. 15 differs from the conventional MOSFET depicted in FIG. 14 on the following 3 points.

A first difference is both bottom corner portions 107d', 107e' of a trench (gate trench) 107' are encompassed by the second $p^+$-type region 122. A second difference is that at both side walls 107a', 107b' of the trench (gate trench) 107', a gate electrode 109' and the $n^+$-type source region 105 oppose each other across the gate insulating film 108'.

A third difference is that a trench 141 that penetrates the $n^+$-type source region 105 and the p-type base region 104, and reaches the n-type current spreading region 103 is provided between the trench 107' and an adjacent trench 107'. A conductive layer 142 is embedded in the trench 141. At both side walls of the trench 141, a SBD (hereinafter, trench-type SBD) 140 is formed by a Schottky contact between the conductive layer 142 and the n-type current spreading region 103.

The conventional MOSFET depicted in FIG. 15 has the trench-type SBD 140 built-in on the semiconductor substrate 130. Provision of the trench-type SBD 140 in this manner disposes the trench-type SBD 140 so as to extend along a direction (vertical direction) orthogonal to the front surface of the semiconductor substrate 130. Therefore, the cell pitch of the MOSFET may be shortened as compared to a case in which the SBD is provided in a flat shape extending in a direction (horizontal direction) along the front surface of the semiconductor substrate 130.

As a conventional trench gate MOSFET having a SBD built-in on the same semiconductor chip, a device has been proposed that has a built-in SBD formed by a Schottky contact between an $n^-$-type drift region and a metal layer that is embedded in a second trench that is between first trenches (gate trenches) (for example, refer to Japanese Laid-Open Patent Publication No. 2017-126604 (paragraphs 0174 to 0178, FIG. 18)). In Japanese Laid-Open Patent Publication No. 2017-126604, a $p^+$-type contact region is provided between the second trench and a p-type base region, thereby reducing contact resistance between the metal layer and the p-type base region, whereby stabilized electric potential is supplied to the p-type base region and MOSFET operation is stabilized.

SUMMARY

According to an embodiment, a semiconductor device includes a semiconductor substrate containing a semiconductor material having a bandgap that is wider than a bandgap of silicon; a first semiconductor layer of a first conductivity type and provided on a front surface of the semiconductor substrate, the first semiconductor layer containing the semiconductor material having the bandgap that is wider than the bandgap of silicon; a second semiconductor layer of a second conductivity type and provided on a first side of the first semiconductor layer, the second semiconductor layer containing the semiconductor material having the bandgap that is wider than the bandgap of silicon, the first side of the first semiconductor layer being opposite a second side of the first semiconductor layer, the second side facing toward the semiconductor substrate; a first semiconductor region of the first conductivity type and selectively provided in the second semiconductor layer; a second semiconductor region of the second conductivity type and selectively provided in the second semiconductor layer, the second semiconductor region being in contact with the first semiconductor region along a direction parallel to the front surface of the semiconductor substrate and having an impurity concentration that is higher than an impurity concentration of the second semiconductor layer; a third semiconductor region of the second conductivity type, the third semiconductor region being a portion of the second semiconductor layer other than the first semiconductor region and the second semiconductor region, and disposed closer to the semiconductor substrate than are the first semiconductor region and the second semiconductor region; a trench penetrating the first semiconductor region, the second semiconductor region, and the third semiconductor region, at a boundary between the first semiconductor region and the second semiconductor region, the trench reaching the first semiconductor layer; a gate insulating film provided along a bottom and a first side wall of the trench; a gate electrode provided at a surface of the first side wall of the trench, via the gate insulating film, and opposing a portion of the third semiconductor region between the first semiconductor region and the first semiconductor layer; an electrode layer provided along a second side wall of the trench and at the second side wall of the trench, forming a Schottky contact or a heterocontact with the second semiconductor region, the third semiconductor region, and the first semiconductor layer; a fourth semiconductor region of the second conductivity type and provided in the first semiconductor layer so as to be separated from the third semiconductor region and encompass a corner formed by the bottom and the second side wall of the trench; a first electrode electrically connected to the first semiconductor region, the second semiconductor region, the fourth semiconductor region, and the electrode layer; and a second electrode provided at a rear surface of the semiconductor substrate.

In the embodiment, the gate insulating film extends between the gate electrode and the electrode layer, and electrically insulates the gate electrode and the electrode layer.

In the embodiment, a thickness of a portion of the gate insulating film between the gate electrode and the electrode layer is greater than a thickness of a portion of the gate insulating film along the first side wall of the trench.

In the embodiment, the bottom of the trench has a step where the bottom near the first side wall is deeper than the bottom near the second side wall. The fourth semiconductor region encompasses a corner formed by the bottom near the first side wall of the trench and a connection portion that is between the bottom near the first side wall of the trench and the bottom near second side wall.

In the embodiment, the fourth semiconductor region encompasses a corner formed by the bottom and the first side wall of the trench, and underlies the bottom of the trench from the corner formed by the bottom and the second side wall of the trench, to the corner formed by the bottom and the first side wall of the trench.

In the embodiment, the electrode layer extends between the bottom of the trench and the gate insulating film, from the second side wall of the trench.

Objects, features, and advantages of the present invention are specifically set forth in or will become apparent from the following detailed description of the invention when read in conjunction with the accompanying drawings.

DESCRIPTION OF EMBODIMENTS

First problems associated with the conventional techniques will be discussed. In general, to obtain a semiconductor substrate (epitaxial substrate) that has an epitaxial layer of a 4-layer periodic hexagonal crystal structure (4H-SiC) having favorable crystallinity, the semiconductor substrate is fabricated by using a starting substrate that has, as a main surface, a crystal plane having an off-angle and on the starting substrate, forming an epitaxial layer by epitaxial growth on the main surface that has the off-angle. As a result, the main surface of the semiconductor substrate is a crystal plane having an off-angle similar to that of the starting substrate.

Figure 15:
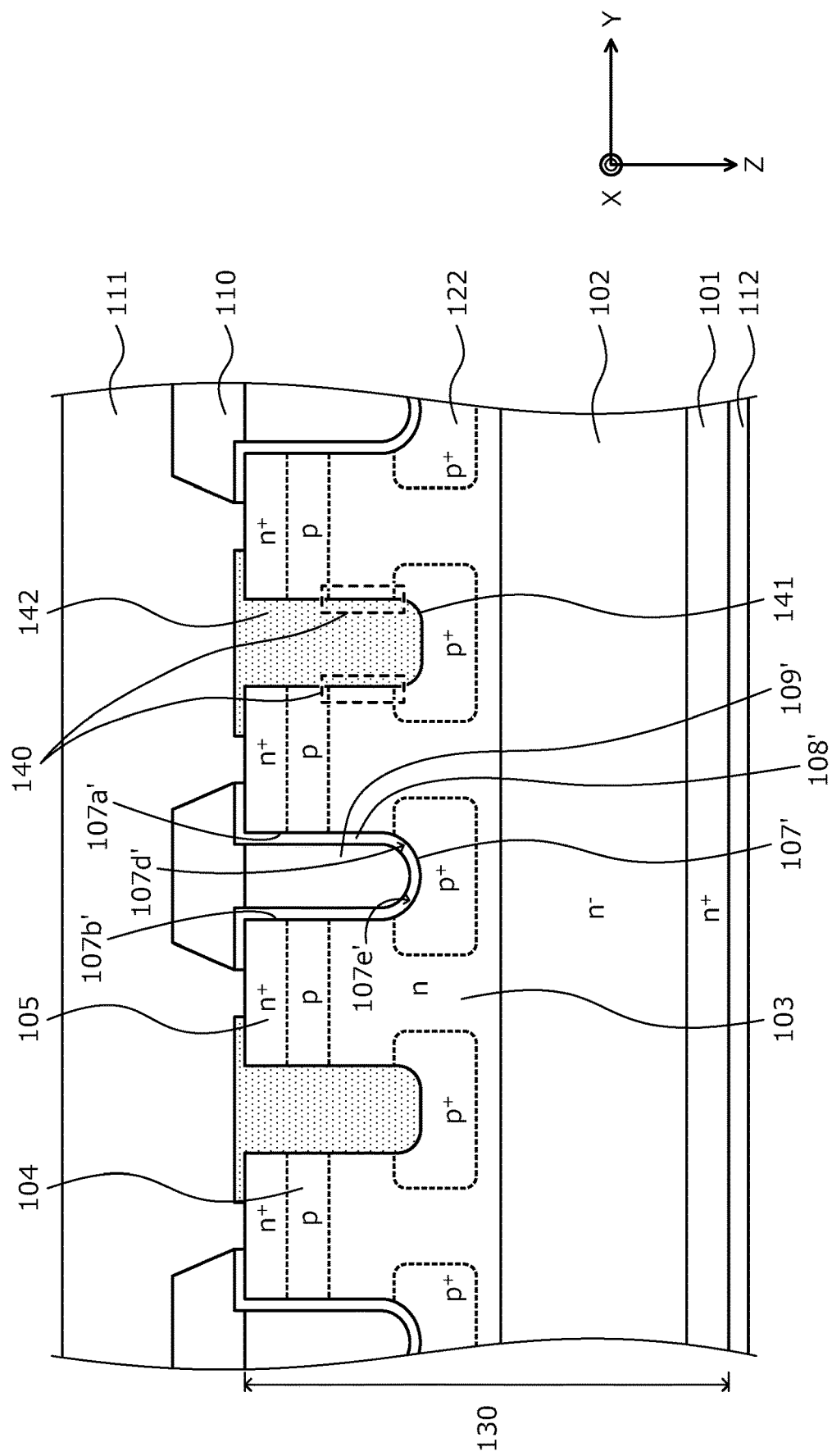
FIG. 15 is a cross-sectional view of another example of a structure of a conventional semiconductor device.

Nonetheless, in the conventional semiconductor substrate depicted in FIG. 15, when a plane orientation of the side walls 107a', 107b' of the trench 107' is a (112-0) plane (i.e., a channel is formed along a (112-0) plane), the off-angle of the main surface of the semiconductor substrate is adversely affected, whereby carrier mobility differs at the side walls 107a', 107b' of the trench 107' and as a consequence, current characteristics become unbalanced between the side walls 107a', 107b' of the trench 107'.

Further, when the plane orientation of the side walls 107a', 107b' of the trench 107' is a (11-00) plane (i.e., a channel is formed along a (11-00) plane), as compared to a case in which the channel is formed along a (112-0) plane, carrier mobility near both of the side walls 107a', 107b' of the trench 107' is low. Therefore, ON resistance increases as compared to the case in which the channel is formed along a (112-0) plane.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
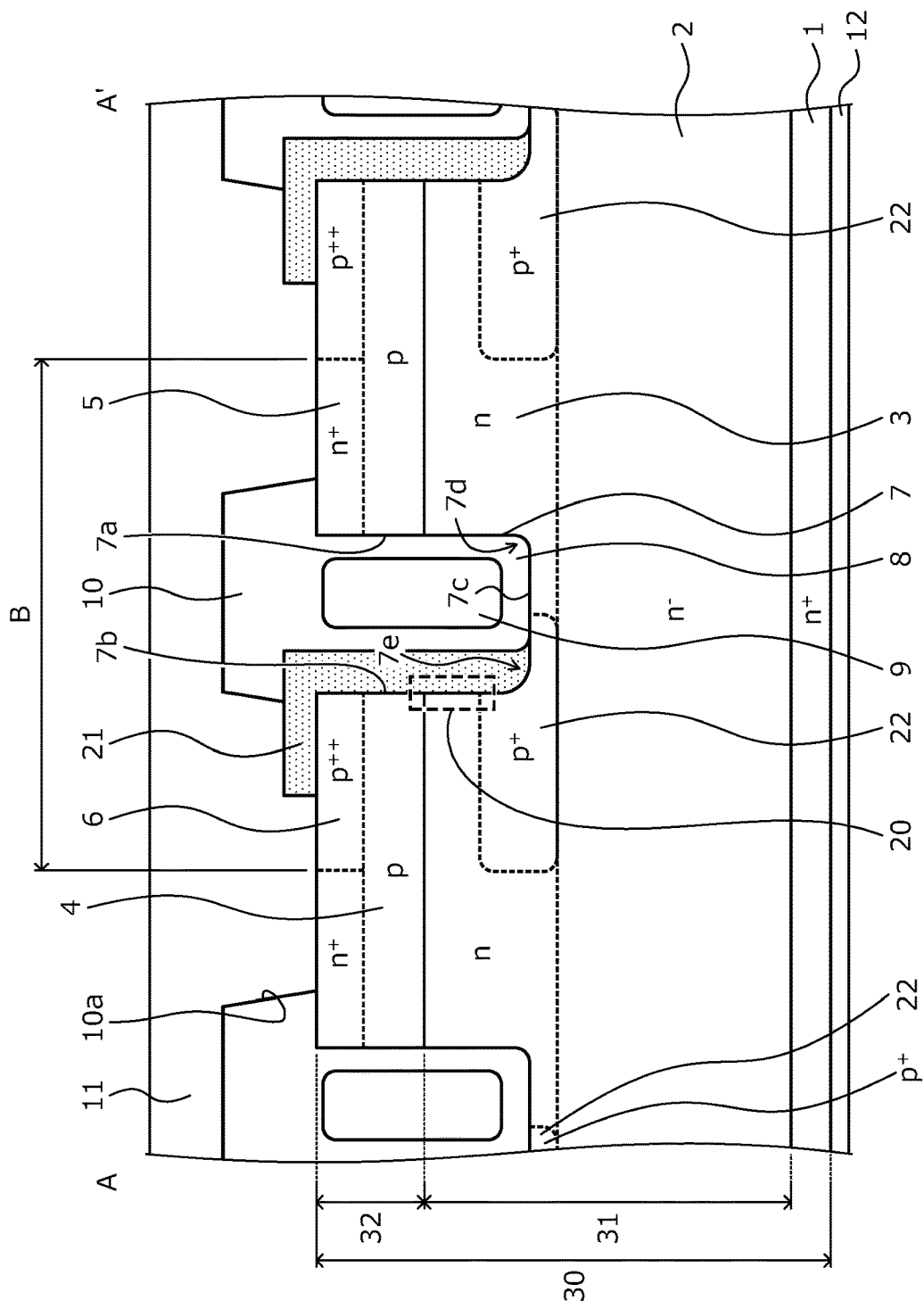
FIG. 1 is a cross-sectional view of a structure of a semiconductor device according to a first embodiment.
Figure 2:
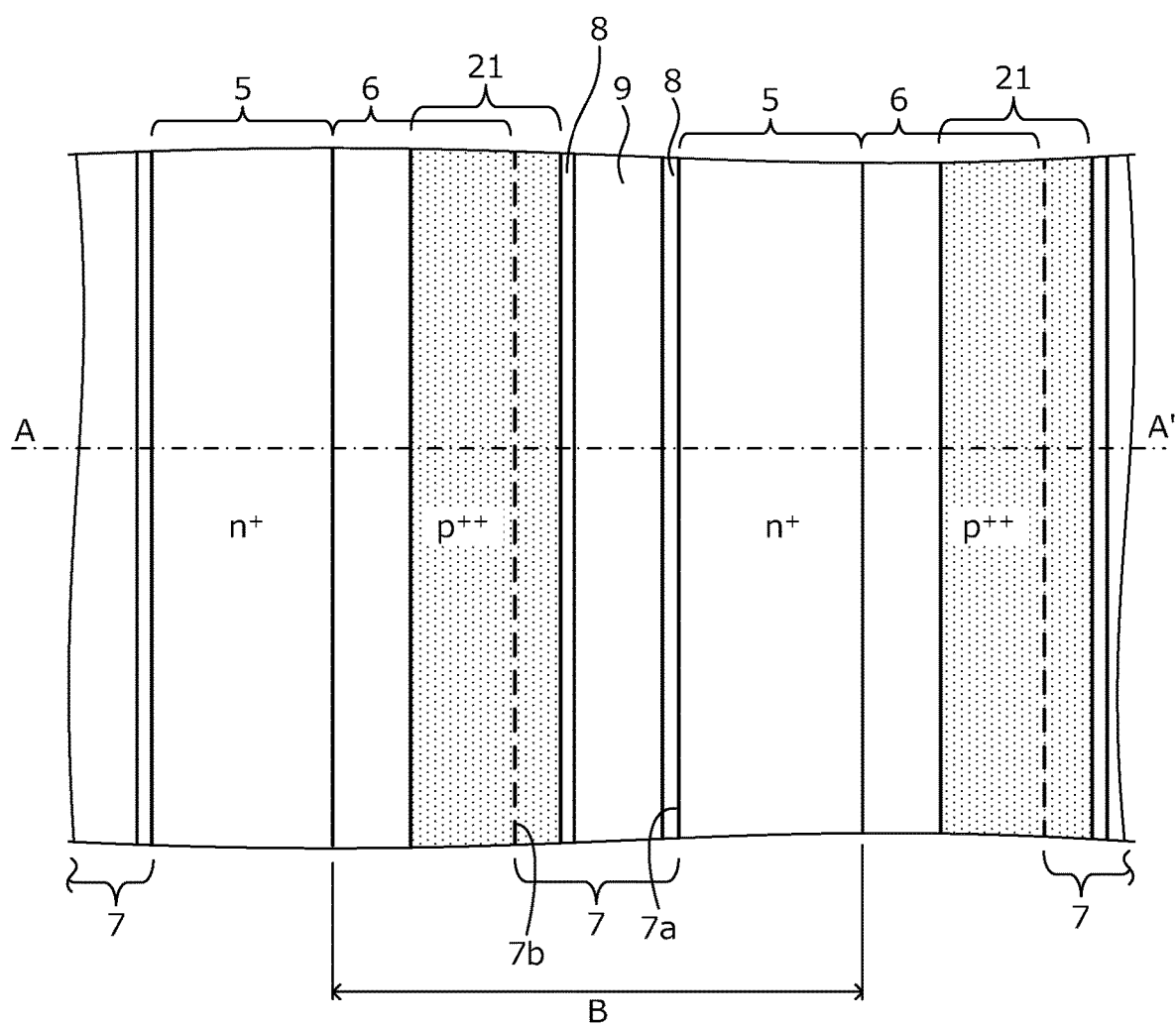
FIG. 2 is a plan view of a layout as viewed from a front surface of a semiconductor substrate depicted in FIG. 1.

A semiconductor device according to a first embodiment is configured using a semiconductor material that has a bandgap (wide bandgap semiconductor material) that is wider than a bandgap of silicon (Si). A structure of the semiconductor device according to the first embodiment will be described taking, as an example, a case in which, for example, silicon carbide (SiC) is used as the wide bandgap semiconductor material. FIG. 1 is a cross-sectional view of the structure of the semiconductor device according to the first embodiment. FIG. 1 depicts a cross-sectional view of the structure along cutting line A-A' depicted in FIG. 2. FIG. 2 is a plan view of a layout as viewed from a front surface of the semiconductor substrate 30 depicted in FIG. 1. Further, FIGS. 1 and 2 depict one unit cell (functional unit of an element) of a MOSFET and half of each adjacent unit cell on each side of the unit cell (similarly in FIGS. 3 to 13).

Further, in FIGS. 1 and 2, only a portion of the unit cells disposed in an active region are depicted and an edge termination region that surrounds a periphery of the active region is not depicted (similarly in FIGS. 3 to 13). The active region is a region through which main current of the MOSFET flows. The edge termination region is a region between the active region and a side surface of the semiconductor substrate (semiconductor chip) 30, and is a region that mitigates electric field on a front surface side of the semiconductor substrate 30 and sustains a breakdown voltage (withstand voltage). In the edge termination region, for example, a general breakdown voltage structure such as a guard ring, a field plate, RESURF, etc. is disposed. The breakdown voltage is a voltage limit at which no damage or errant operation of the semiconductor device occurs. FIG. 2 depicts a layout of an $n^+$-type source region 5, a $p^{++}$-type contact region 6, a trench 7, and a conductive layer (electrode layer) 21.

The semiconductor device according to the first embodiment and depicted in FIGS. 1 and 2 is a trench gate MOSFET that has a MOS gate (an insulated gate having a 3-layer structure constituted by a metal, an oxide film, and a semiconductor material) on the front surface side of the semiconductor substrate 30 that contains silicon carbide, and the semiconductor device has a trench-side-wall SBD 20 built-in on the same semiconductor substrate 30. The MOS gate structure is constituted by a p-type base region (third semiconductor region) 4, the $n^+$-type source region (first semiconductor region) 5, the $p^{++}$-type contact region (second semiconductor region) 6, the trench 7, a gate insulating film 8, and a gate electrode 9. When the MOSFET is ON, an n-type inversion layer (channel) is formed along a first side wall 7a of the trench 7.

The trench-side-wall SBD 20 is formed by a Schottky junction between an n-type current spreading region 3 and the conductive layer 21 formed along a second side wall 7b of the trench 7, and exhibits a rectifying action by a Schottky contact between the conductive layer 21 and the n-type current spreading region 3. In FIG. 2, the second side wall 7b of the trench 7 is indicated by a dashed line. The trench-side-wall SBD 20 has a function of preventing forward degradation that is due to operation of a parasitic pn diode (body diode) formed in the MOSFET. The parasitic pn diode is formed by pn junctions between the p-type base region 4, a $p^+$-type region (fourth semiconductor region) 22 and an $n^-$-type drift region 2; and pn junctions between the p-type base region 4, a $p^+$-type region (fourth semiconductor region) 22 and the n-type current spreading region 3.

In particular, the semiconductor substrate 30 is a silicon carbide epitaxial substrate in which an $n^-$-type silicon carbide layer (first semiconductor layer) 31 and a p-type silicon carbide layer (second semiconductor layer) 32 that respectively constitute the $n^-$-type drift region 2 and the p-type base region 4 are sequentially formed by epitaxial growth on an $n^+$-type starting substrate 1 that contains silicon carbide. The front surface of the semiconductor substrate 30 may have an off-angle. In a surface layer of the $n^-$-type silicon carbide layer 31, the surface layer on a source side (side facing toward a source electrode (first electrode) 11) of the $n^-$-type silicon carbide layer 31, the n-type region (hereinafter, n-type current spreading region) 3 is provided so as to be in contact with the p-type silicon carbide layer 32 (the p-type base region 4). The n-type current spreading region 3 is a so-called current spreading layer (CSL) that reduces spreading resistance.

The n-type current spreading region 3 is provided uniformly along a direction parallel to the substrate front surface. The n-type current spreading region 3, from an interface with the p-type base region 4, reaches a position deeper toward a drain side (side having a drain electrode (second electrode) 12) than is a position of a bottom 7c of the trench 7. A portion of the n⁻-type silicon carbide layer 31 other than the n-type current spreading region 3 constitutes the n⁻-type drift region 2. The n-type current spreading region 3, between the n⁻-type drift region 2 and the p-type base region 4, is exposed at first and second side walls 7a, 7b of the trench 7. Further, the n-type current spreading region 3 encompasses a bottom corner portion 7d at the first side wall 7a, from the first side wall 7a of the trench 7 to a portion of the bottom 7c.

In the n-type current spreading region 3, the p⁺-type region 22 is selectively provided. The p⁺-type region 22 encompasses a bottom corner portion 7e at the second side wall 7b, from the second side wall 7b of the trench 7 to a portion of the bottom 7c. The bottom corner portions 7d, 7e of the trench 7 are, respectively, a portion where the bottom 7c and the first wall 7a of the trench 7 are connected and a portion where the bottom 7c and the second side 7b of the trench 7 are connected. In other words, the p⁺-type region 22 is provided separated from the p-type base region 4, and from a position deeper toward the drain side than is a position of the interface between the p-type base region 4 and the n-type current spreading region 3, reaches a position deeper toward the drain side than is a position of the bottom 7c of the trench 7. The p⁺-type region 22 may be in contact with the n⁻-type drift region 2.

The p⁺-type region 22, along a depth direction Z, opposes the p⁺⁺-type contact region 6 and does not oppose the n⁺-type source region 5. Additionally, the p⁺-type region 22, from the trench 7 whose bottom corner portion 7e the p⁺-type region 22 encompasses, extends toward an adjacent trench 7 (second direction Y described hereinafter) nearest the second side wall 7b of the trench 7 whose bottom corner portion 7e the p⁺-type region 22 encompasses and, for example, the p⁺-type region 22 terminates in a vicinity of a boundary between the n⁺-type source region 5 and the p⁺⁺-type contact region 6. In other words, the p⁺-type regions 22 respectively encompassing the bottom corner portions 7e at the second side walls 7b of the trenches 7 are disposed to be separated from each other. The depth direction Z is a direction from the front surface of the semiconductor substrate 30 toward a rear surface.

Further, the p⁺-type region 22 is electrically connected to the source electrode 11 at a portion not depicted (for example, a portion near a boundary between the active region and the edge termination region, along a direction of view in FIG. 1). The p⁺-type region 22 is disposed in a striped layout that extends along a direction (hereinafter, first direction) X that is parallel to the front surface of the semiconductor substrate 30 (the direction of view in FIG. 1, the vertical direction in FIG. 2). The p⁺-type region 22 is depleted when the MOSFET is OFF and thus, has a function of mitigating electric field applied to the bottom corner portion 7e at the second side wall 7b of the trench 7. Provision of the p⁺-type region 22 enables cell pitch (unit cell repetition width) of MOSFET to be shortened and ON resistance to be reduced while the breakdown voltage is maintained.

The n⁺-type source region 5 and the p⁺⁺-type contact region 6 are each selectively provided in a surface region (surface layer at the front surface of the semiconductor substrate 30) of the p-type silicon carbide layer 32. The n⁺-type source region 5 and the p⁺⁺-type contact region 6 are disposed to contact each other along a direction (hereinafter, the second direction) Y that is parallel to the front surface of the semiconductor substrate 30 and orthogonal to the first direction X, and to alternate each other along the second direction Y. Further, the n⁺-type source region 5 and the p⁺⁺-type contact region 6 are disposed in a striped layout extending along the first direction X (refer to FIG. 2). A portion of the p-type silicon carbide layer 32 other than the n⁺-type source region 5 and the p⁺⁺-type contact region 6 constitutes the p-type base region 4.

Further, in the p-type silicon carbide layer 32, the trench 7 is provided to penetrate the p-type silicon carbide layer 32 in the depth direction Z from the front surface of the semiconductor substrate 30 (a surface of the p-type silicon carbide layer 32) and reach the n-type current spreading region 3. The trench 7 is disposed in a striped layout extending along the first direction X. The trench 7, at the boundary between the n⁺-type source region 5 and the p⁺⁺-type contact region 6, penetrates the n⁺-type source region 5, the p⁺⁺-type contact region 6 and the p-type base region 4, and reaches the n-type current spreading region 3. In other words, one of the n⁺-type source regions 5 and one of the p⁺⁺-type contact regions 6 are each disposed between the trench 7 and an adjacent trench 7 (mesa region). The bottom corner portion 7d at the first side wall 7a of the trench 7 terminates in the n-type current spreading region 3 while the bottom corner portion 7e at the second side wall 7b terminates in the p⁺-type region 22.

The n⁺-type source region 5, the p-type base region 4, and the n-type current spreading region 3 are exposed at the first side wall 7a of the trench 7, sequentially in the depth direction from the front surface of the semiconductor substrate 30. The p⁺⁺-type contact region 6, the p-type base region 4, the n-type current spreading region 3, and the p⁺-type region 22 are exposed at the second side wall 7b of the trench 7, sequentially in the depth direction from the front surface of the semiconductor substrate 30. The bottom corner portions 7d, 7e of the trench 7 may have an arc-shape of a predetermined curvature. The first and the second side walls 7a, 7b of the trench 7 are faces of an inner wall of the trench 7, are continuous with the front surface of the semiconductor substrate 30, and are substantially orthogonal to the front surface of the semiconductor substrate 30.

The conductive layer 21 (hatched portion) that is, for example, a poly-silicon (poly-Si) layer, is provided in the trench 7, along the second side wall 7b of the trench 7 so as to span the second side wall 7b of the trench 7 and the bottom corner portion 7e at the second side wall 7b. In other words, the conductive layer 21 is in contact with the p⁺⁺-type contact region 6, the p-type base region 4, the n-type current spreading region 3, and the p⁺-type region 22, at the second side wall 7b of the trench 7.

Further, the conductive layer 21 extends from the second side wall 7b of the trench 7 and onto the front surface of the semiconductor substrate 30 so as to cover a portion of the p⁺⁺-type contact region 6, and on the front surface of the semiconductor substrate 30, is electrically connected to the source electrode 11. The conductive layer 21, for example, may be a poly-silicon layer that is easily formed in terms of processing or may be a metal layer of nickel (Ni) or titanium (Ti), titanium nitride (TiN), tungsten (W), etc. The trench-side-wall SBD 20 is configured by the Schottky contact between the conductive layer 21 and the n-type current spreading region 3. The trench-side-wall SBD 20 is disposed along the second side wall 7b of the trench 7, extending in the depth direction Z (the vertical direction).

Further, in the trench 7, from the first side wall 7a and the bottom 7c of the trench 7, the gate insulating film 8 is provided along a surface (a surface of the conductive layer 21 on a first side of the conductive layer 21 opposite a second side thereof facing toward the second side wall 7b of the trench 7) of the conductive layer 21. The gate insulating film 8 suffices to have on a surface of the first side wall 7a of the trench 7, a portion of a uniform thickness corresponding to a gate threshold voltage of the MOSFET, and on a surface of the second side wall 7b of the trench 7, a portion provided to an extent so as to provide electrical insulation from the conductive layer 21.

In the trench 7, the gate electrode 9 that is, for example, a poly-silicon layer is provided on the gate insulating film 8. At the first side wall 7a of the trench 7, the gate electrode 9 opposes across the gate insulating film 8, a portion of the p-type base region 4 between the $n^+$-type source region 5 and the n-type current spreading region 3. Therefore, when the MOSFET is ON, an n-type inversion layer (channel) is formed along the first side wall 7a of the trench 7. On the other hand, a side of the gate electrode 9 facing toward the second side wall 7b of the trench 7 opposes the conductive layer 21, across the gate insulating film 8. In other words, when the MOSFET is ON, no channel is formed along the second side wall 7b of the trench 7. The gate electrode 9 is electrically insulated from the conductive layer 21 by the gate insulating film 8.

By disposing the trench 7 (gate trench) in this manner, gate characteristics may be enhanced by variously selecting a crystal plane for the first side wall 7a of the trench 7. In particular, for example, when the front surface of the semiconductor substrate 30 is the (000-1) plane (so-called carbon face (C-face)) or the (0001) plane (so-called silicon face (Si-face)), of the (11-00) plane and the (112-0) plane (so-called m-plane and a-plane) that may constitute the crystal plane of the first and the second side walls 7a, 7b of the trench 7, the a-plane having high carrier mobility is set as the crystal plane of the first side wall 7a of the trench 7, whereby it becomes possible to realize reductions in the ON resistance. Further, of the first and the second side walls 7a, 7b of the trench 7, the trench-side-wall SBD 20 is formed at the second side wall 7b, whereby, as described above, no channel is formed along the second side wall 7b of the trench 7. Therefore, by setting the plane orientations of both of the first and the second side walls 7a, 7b of the trench 7 to the a-plane, even when the carrier mobility of each of the first and the second side walls 7a, 7b of the trench 7 differs due to effects of the off-angle of the front surface of the semiconductor substrate 30, current characteristics between the first and the second side walls 7a, 7b of the trench 7 do not become unbalanced.

An interlayer insulating film 10 is provided on the front surface of the semiconductor substrate 30 so as to cover the gate electrode 9. In a contact hole 10a of the interlayer insulating film 10, the $n^+$-type source region 5, the $p^{++}$-type contact region 6, and the conductive layer 21 are exposed. The source electrode 11 is electrically connected to the $n^+$-type source region 5, the $p^{++}$-type contact region 6, and the conductive layer 21, via the contact hole 10a. Further, the source electrode 11 is electrically insulated from the gate electrode 9 by the interlayer insulating film 10. The drain electrode 12 is provided on a rear surface (rear surface of the $n^+$-type starting substrate 1 constituting an $n^+$-type drain region) of the semiconductor substrate 30 overall. The drain electrode 12 is electrically connected to the $n^+$-type starting substrate 1.

In this manner, one unit cell B of the MOSFET is constituted by the gate electrode 9 of one trench 7 and, an adjacent $n^+$-type source region 5 and an adjacent $p^{++}$-type contact region 6 sandwiching the one trench 7. In the unit cell B of the MOSFET, one trench-side-wall SBD 20 is disposed. The trench-side-wall SBD 20 is disposed along the second side wall 7b of the trench 7 so as to extend in the depth direction Z (the vertical direction), whereby the trench-side-wall SBD 20 may be built-in on the same semiconductor substrate 30 as the MOSFET without increasing the cell pitch. Therefore, the cell pitch of the MOSFET may be reduced as compared to a case in which a SBD is provided in a flat shape extending in a direction (the horizontal direction) along the front surface of the semiconductor substrate 30.

Figure 3:
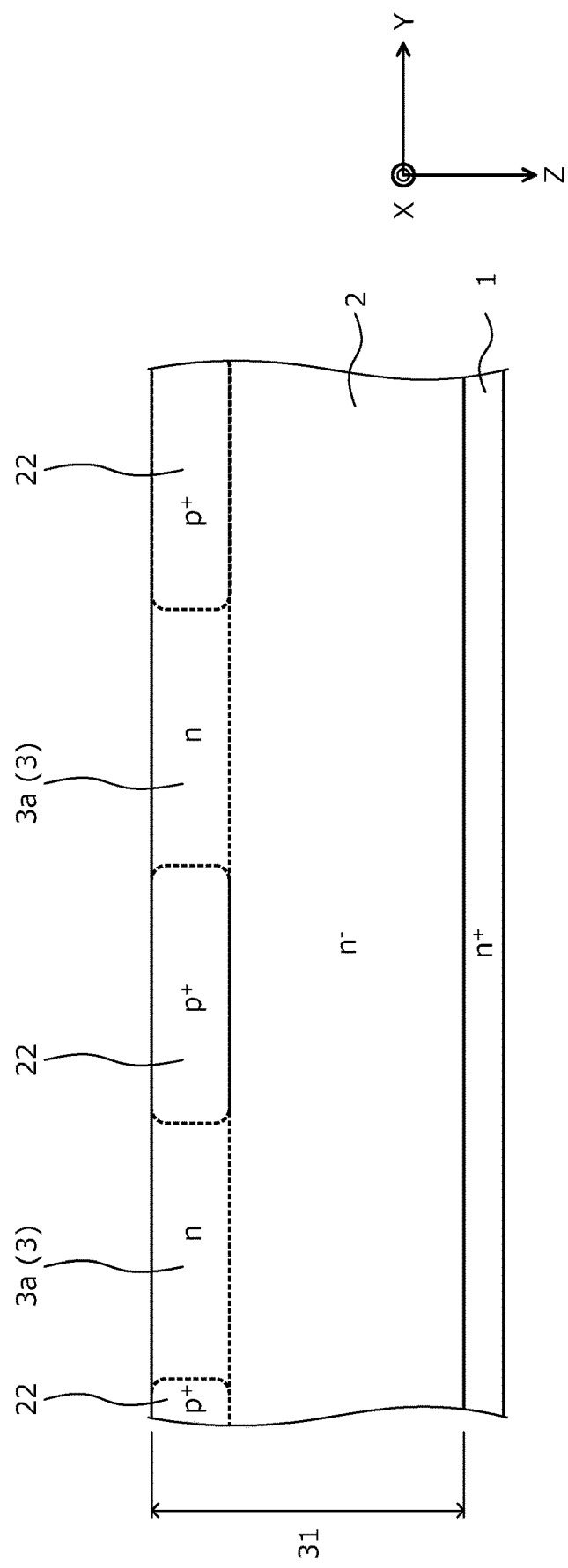
FIG. 3 is a cross-sectional view of the semiconductor device according to the first embodiment during manufacture.
Figure 4:
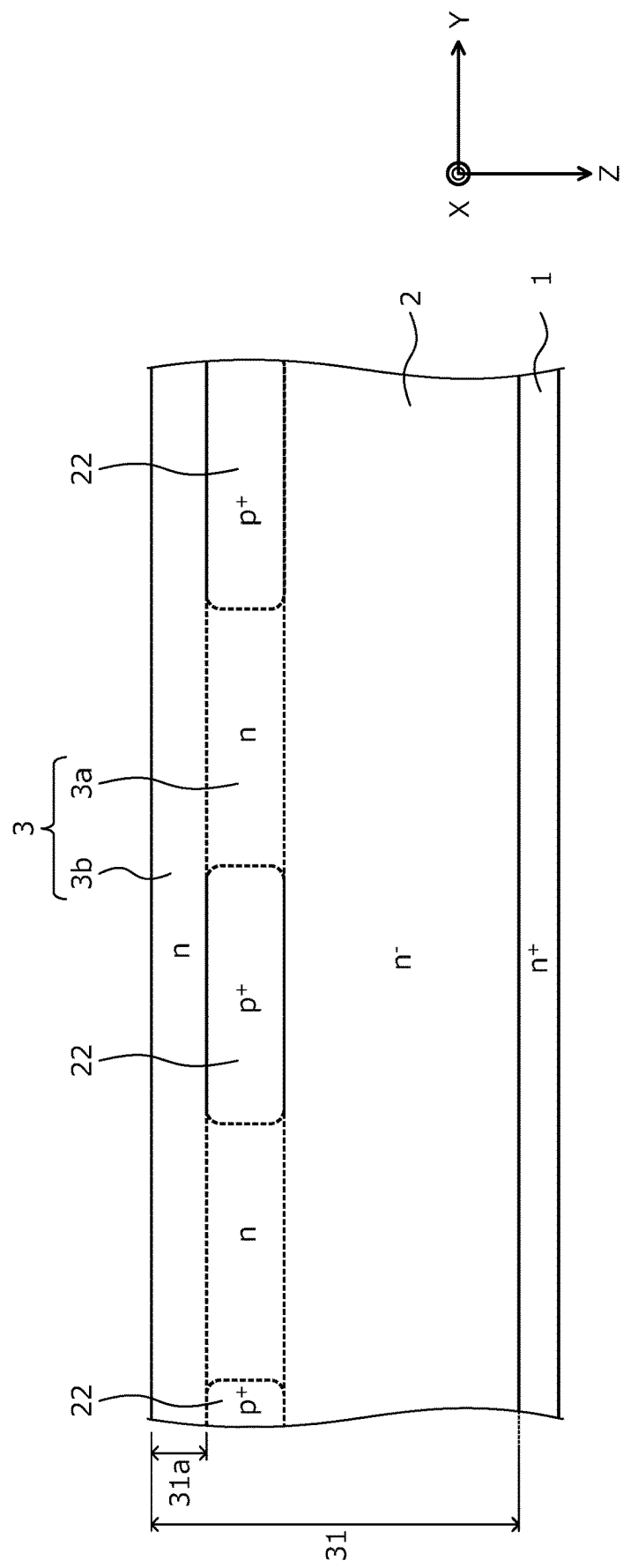
FIG. 4 is a cross-sectional view of the semiconductor device according to the first embodiment during manufacture.

A method of manufacturing the semiconductor device according to the first embodiment will be described. FIGS. 3, 4, 5, 6, 7, and 8 are cross-sectional views of the semiconductor device according to the first embodiment during manufacture. First, as depicted in FIG. 3, the $n^+$-type starting substrate 1 constituting the $n^+$-type drain region is prepared. Next, on a front surface of the $n^+$-type starting substrate 1, the $n^-$-type silicon carbide layer 31 is formed by epitaxial growth. Next, as depicted in FIG. 4, the $p^+$-type region 22 is selectively formed in a surface layer of the $n^-$-type silicon carbide layer 31 by photolithography and ion implantation of a p-type impurity.

Next, by photolithography and ion implantation of an n-type impurity, for example, an n-type region (hereinafter, n-type partial region) 3a is formed in a surface payer of the $n^-$-type silicon carbide layer 31, spanning the active region overall. The n-type partial region 3a is a portion of the n-type current spreading region 3. Here, a depth of the n-type partial region 3a, for example, is substantially equal to a depth of the $p^+$-type region 22. A portion of the $n^-$-type silicon carbide layer 31 closer to the drain side than is the n-type partial region 3a constitutes the $n^-$-type drift region 2. A sequence in which the n-type partial region 3a and the $p^+$-type region 22 are formed may be interchanged.

Next, an $n^-$-type silicon carbide layer is further formed on the $n^-$-type silicon carbide layer 31 by epitaxial growth, thereby increasing a thickness of the $n^-$-type silicon carbide layer 31. Next, for example, in the active region overall, in the portion (surface layer of the $n^-$-type silicon carbide layer 31) 31a by which the thickness of the $n^-$-type silicon carbide layer 31 is increased, an n-type partial region 3b is formed at a depth reaching the n-type partial region 3a. The n-type partial region 3b has an impurity concentration that is substantially equal to an impurity concentration of the n-type partial region 3a. The n-type partial regions 3a, 3b are connected along the depth direction Z, thereby forming the n-type current spreading region 3.

Figure 5:
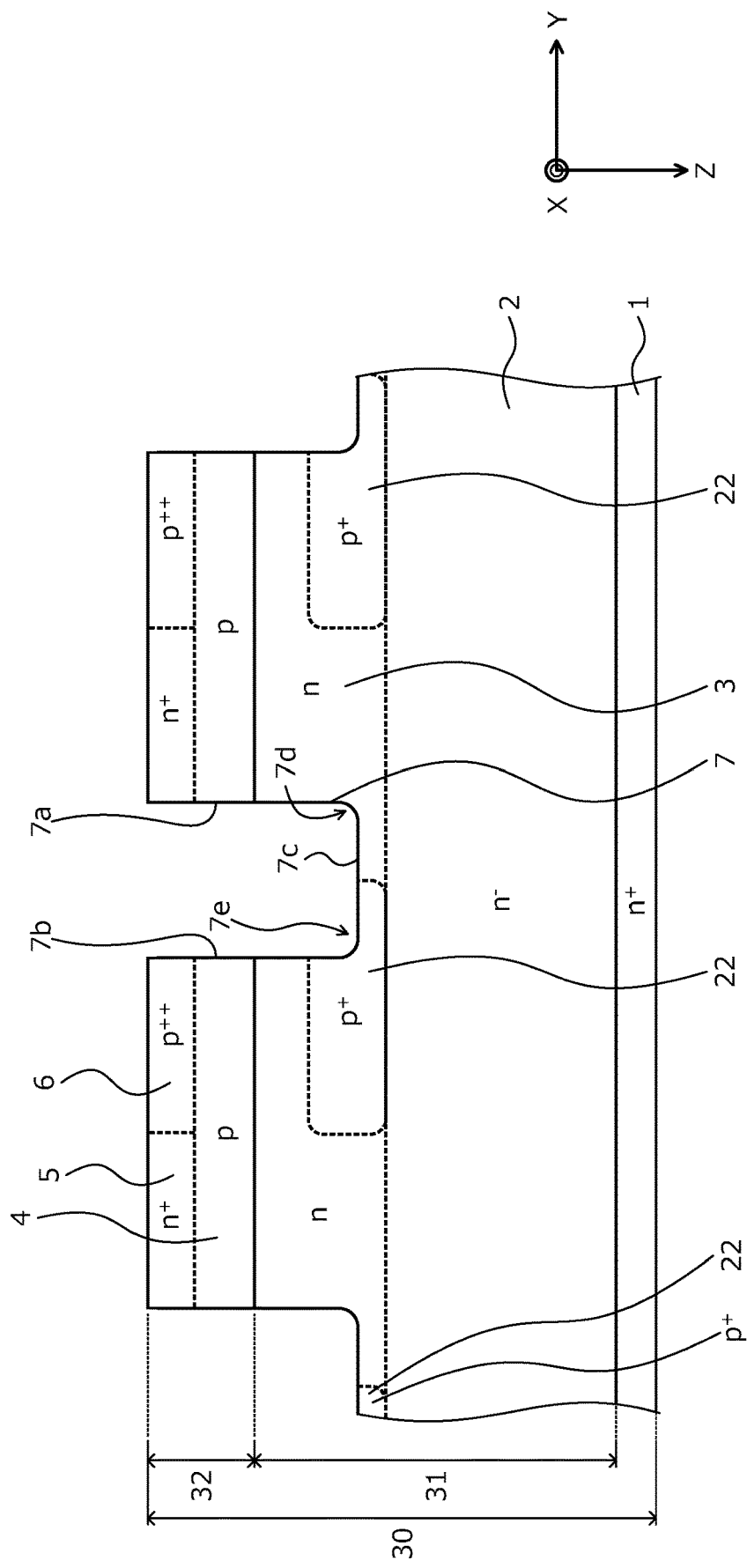
FIG. 5 is a cross-sectional view of the semiconductor device according to the first embodiment during manufacture.

Next, as depicted in FIG. 5, the p-type silicon carbide layer 32 is formed on the $n^-$-type silicon carbide layer 31 by epitaxial growth. As a result, the silicon carbide substrate (semiconductor wafer) 30 in which the $n^-$-type silicon carbide layer 31 and the p-type silicon carbide layer 32 are sequentially stacked on the $n^+$-type starting substrate 1 is formed. Next, a process including photolithography and ion implantation as 1 set is repeatedly performed under different conditions to selectively form the $n^+$-type source region 5 and the $p^{++}$-type contact region 6 in the surface layer of the p-type silicon carbide layer 32.

A sequence in which the $n^+$-type source region 5 and the $p^{++}$-type contact region 6 are formed may be interchanged. A portion of the p-type silicon carbide layer 32 other than the $n^+$-type source region 5 and the $p^{++}$-type contact region 6 constitutes the p-type base region 4. In all the ion implantations performed in this manufacturing process, resist films or oxide films ($SiO_2$ film) may be used as masks formed by photolithography.

Next, by photolithography and etching, the trench 7 is formed to penetrate the n$^+$-type source region 5, the p$^{++}$-type contact region 6 and the p-type base region 4, and reach the p$^+$-type region 22 in the n-type current spreading region 3. Here, the trench 7 is disposed so that the bottom corner portion 7d at the first side wall 7a terminates in the n-type current spreading region 3, and the bottom corner portion 7e at the second side wall 7b terminates in the p$^+$-type region 22. As a result, the n$^+$-type source region 5, the p-type base region 4, and the n-type current spreading region 3 are exposed at the first side wall 7a of the trench 7. The p$^{++}$-type contact region 6, the p-type base region 4, the n-type current spreading region 3, and the p$^+$-type region 22 are exposed at the second side wall 7b of the trench 7.

Figure 6:
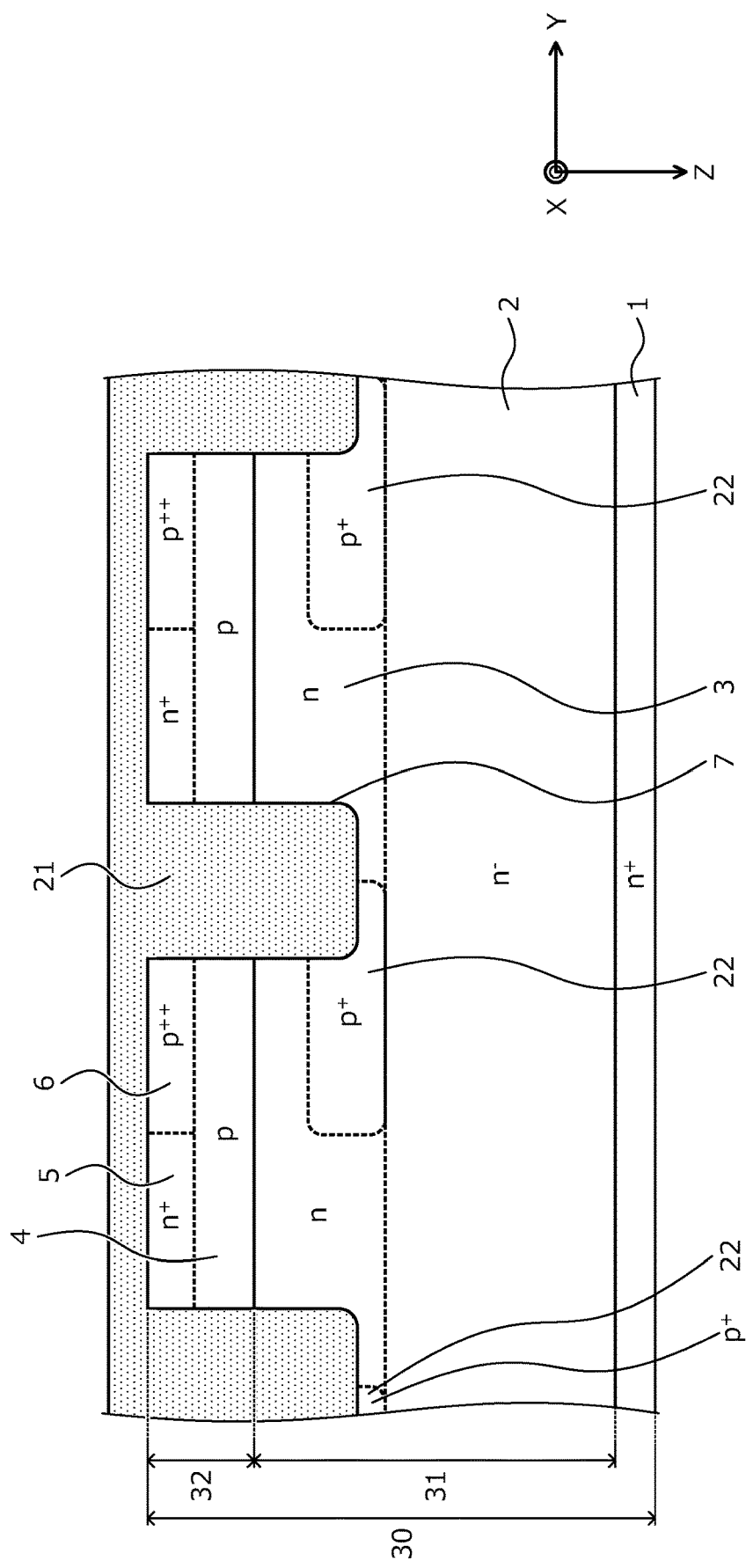
FIG. 6 is a cross-sectional view of the semiconductor device according to the first embodiment during manufacture.

Next, as depicted in FIG. 6, for example, the conductive layer 21 that is a poly-silicon layer is deposited (formed) on the front surface of the semiconductor substrate 30 by a chemical vapor deposition (CVD) method so as to be embedded in the trench 7.

Figure 7:
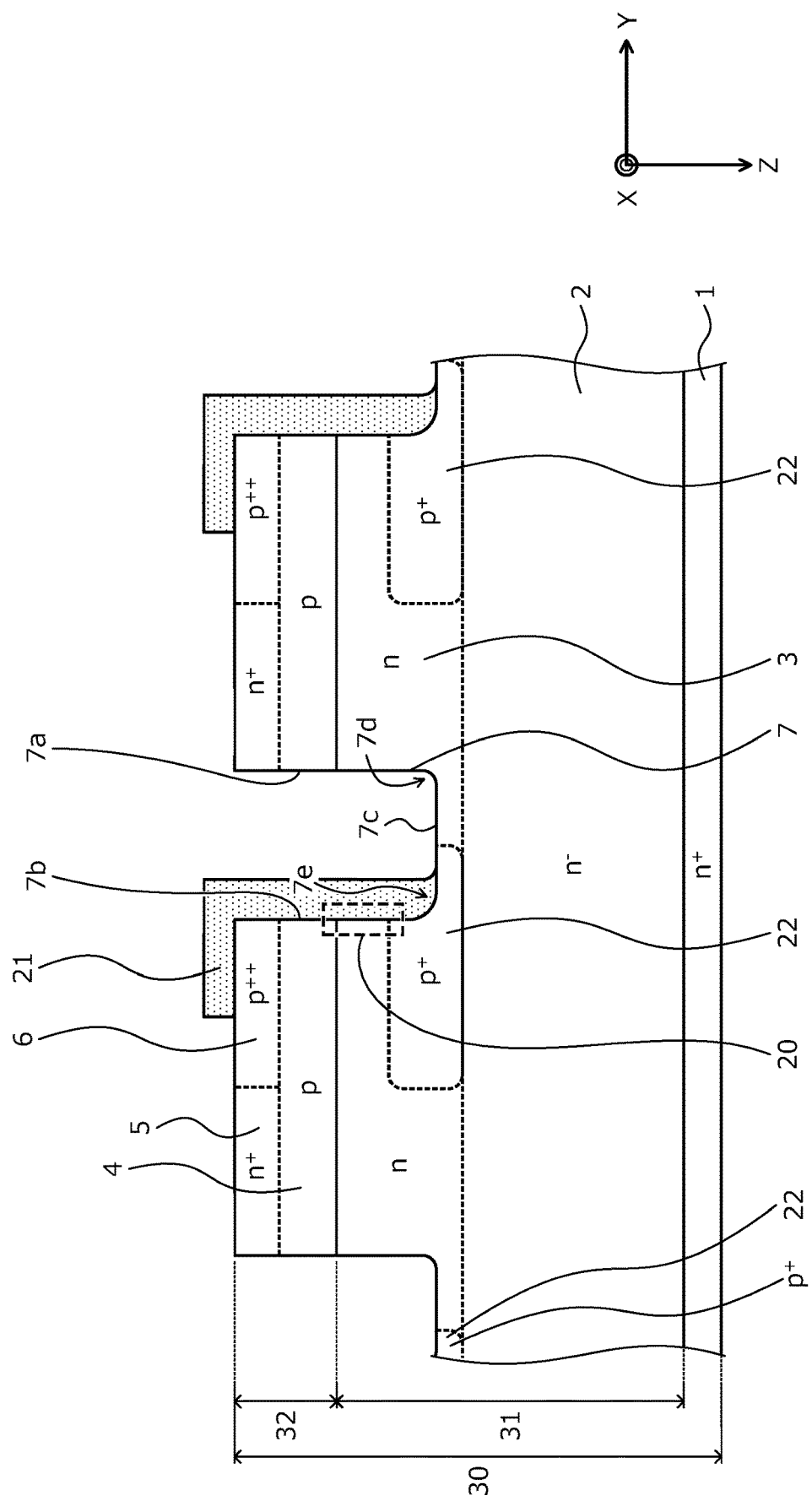
FIG. 7 is a cross-sectional view of the semiconductor device according to the first embodiment during manufacture.

Next, as depicted in FIG. 7, the conductive layer 21 is selectively removed by photolithography and etching so that a portion of the conductive layer 21 remains on the surface of the p$^{++}$-type contact region 6 and along the second side wall 7b of the trench 7 and the bottom 7c. The trench-side-wall SBD 20 is formed at the second side wall 7b of the trench 7 by the Schottky contact between the conductive layer 21 and the n-type current spreading region 3. A semiconductor portion (the n$^+$-type source region 5, the p-type base region 4, and the n-type current spreading region 3) is exposed at the first side wall 7a of the trench 7 and at a portion of the bottom 7c.

Figure 8:
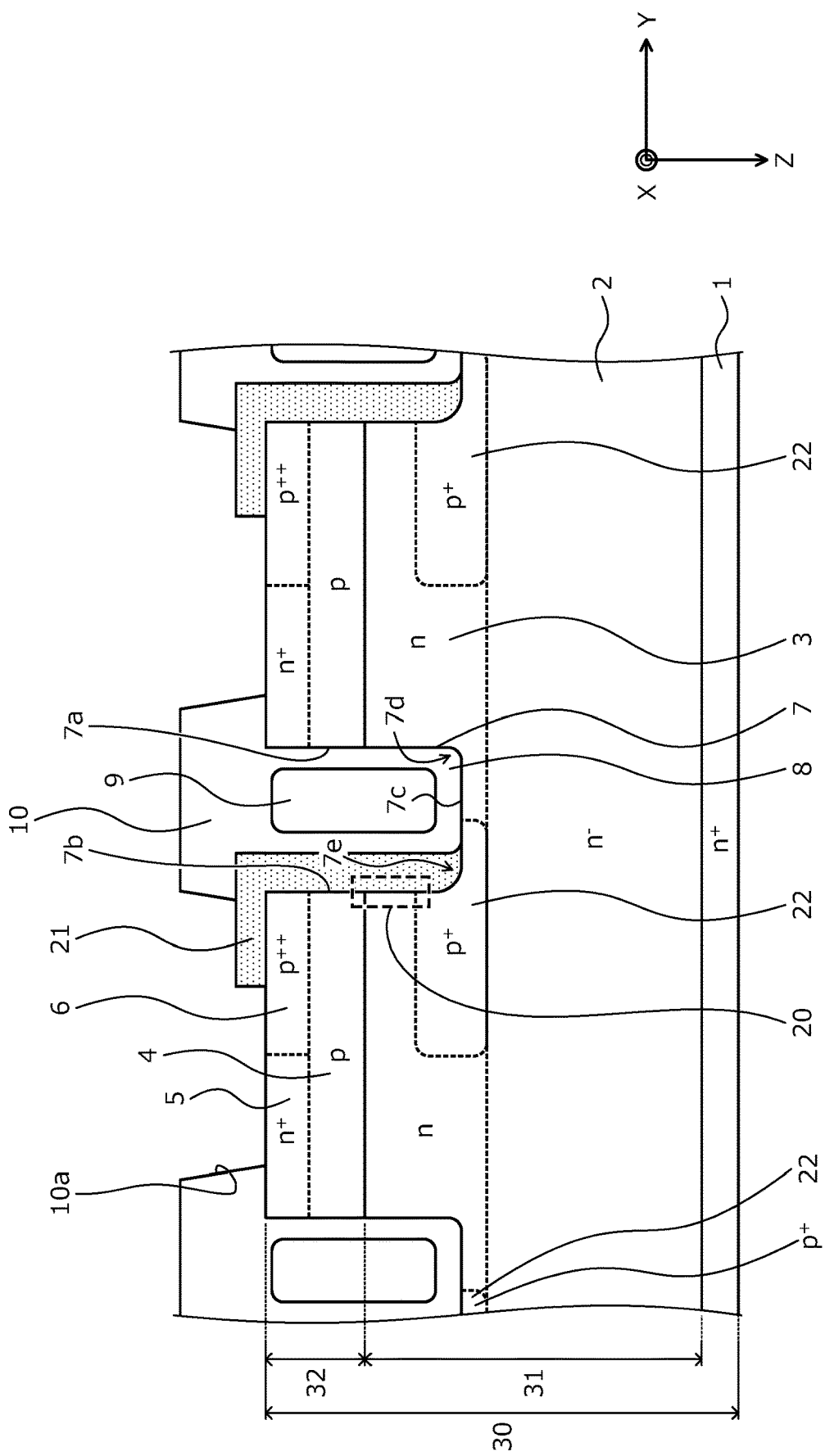
FIG. 8 is a cross-sectional view of the semiconductor device according to the first embodiment during manufacture.

Next, as depicted in FIG. 8, the gate insulating film 8 is deposited (formed) along the surface of the conductive layer 21 from the first side wall 7a of the trench 7 and the bottom 7c by, for example, a CVD method. Next, interface state density (Dit) of an interface between the gate insulating film 8 and the semiconductor portion is reduced by a heat treatment (post deposition annealing (PDA) process).

Next, for example, a poly-silicon layer that constitutes the gate electrode 9 is deposited (formed) on the front surface of the semiconductor substrate 30 by a CVD method so as to be embedded in the trench 7. Next, the poly-silicon layer is selective removed by photolithography and etching so that a portion of the poly-silicon layer in the trench 7 remains as the gate electrode 9.

Next, for example, the interlayer insulating film 10 is deposited (formed) on the front surface of the semiconductor substrate 30 by a CVD method so as to cover the conductive layer 21 and the gate electrode 9. Next, the interlayer insulating film 10 is selectively removed by photolithography and etching so as to form the contact hole 10a that penetrates the interlayer insulating film 10 in the depth direction Z. The n$^+$-type source region 5, the p$^{++}$-type contact region 6, and the conductive layer 21 are exposed in the contact hole 10a.

Next, a metal layer that constitutes the source electrode 11 is deposited (formed) on the front surface of the semiconductor substrate 30 so as to be embedded in the contact hole 10a. Next, the metal layer is selectively removed by photolithography and etching so that a portion of the metal layer constituting the source electrode 11 (source pad) remains. A gate pad (non-depicted electrode pad electrically connected to the gate electrode 9) may be formed by a portion of the metal layer concurrently with the source electrode 11. The drain electrode 12 is formed on the rear surface of the semiconductor substrate 30. Thereafter, the semiconductor wafer is diced (cut) into individual chips, whereby the MOSFET that has the trench-side-wall SBD 20 depicted in FIG. 1 built-in on the same semiconductor substrate 30 (semiconductor chip) is completed.

In the described semiconductor device according to the first embodiment, the n-type current spreading region 3 may be omitted. In this case, the p$^+$-type region 22 is disposed in the n$^-$-type drift region 2, and the trench-side-wall SBD 20 is configured by a Schottky contact between the n$^-$-type drift region 2 and the n-type current spreading region 3.

Figure 14:
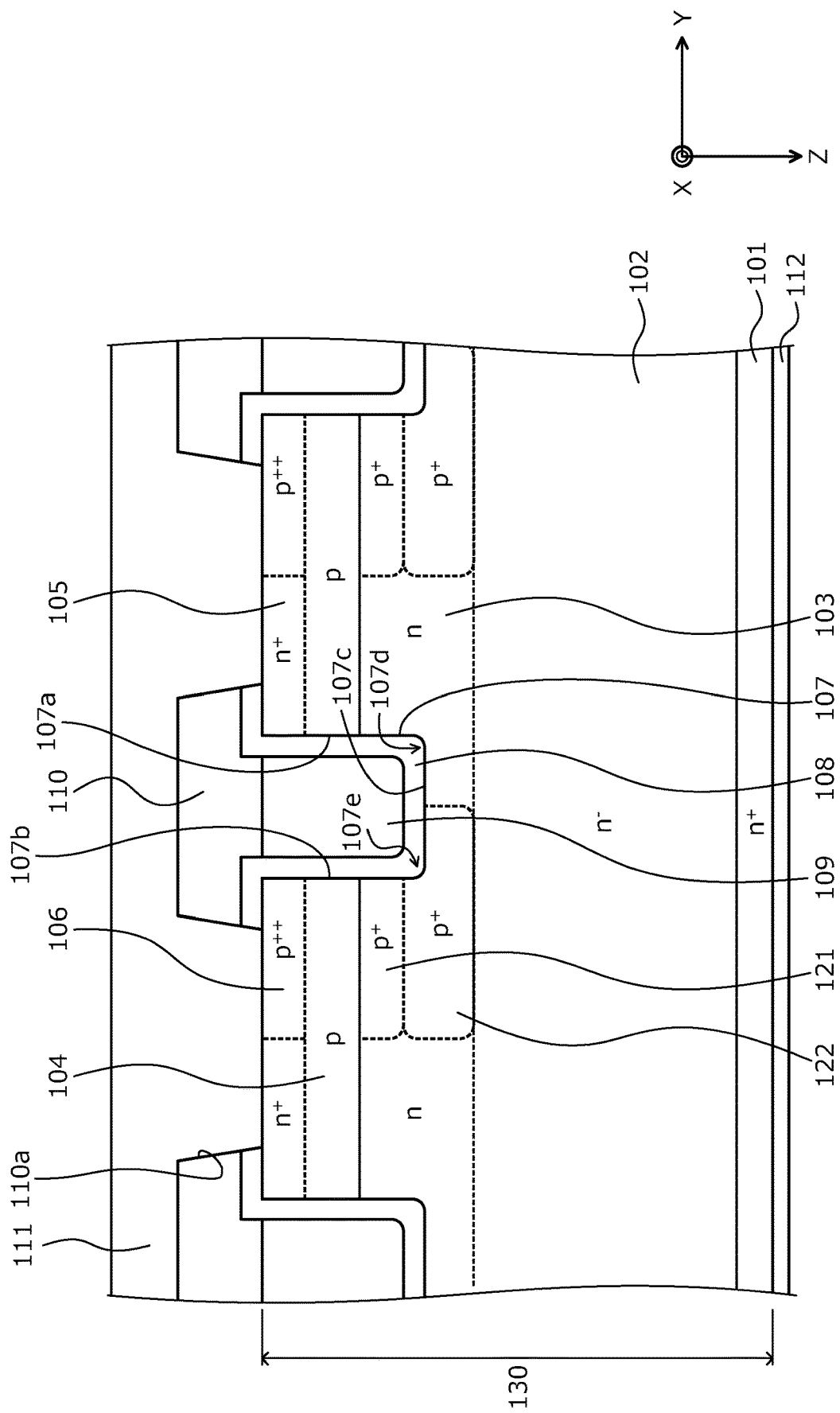
FIG. 14 is a cross-sectional view of a structure of a conventional semiconductor device.

As described above, according to the first embodiment, the MOS gate structure is disposed so that a channel is formed along the first side wall of the trench and the trench-side-wall SBD is disposed along the second side wall of the trench. As a result, the SBD may be built-in on the same semiconductor chip as the MOSFET while maintaining substantially the same cell pitch as that of the conventional MOSFET (refer to FIG. 14) that does not have the built-in SBD. Since the cell pitch is maintained, the ON resistance does not increase. As a result, the ON resistance may be reduced to a same extent as with the conventional MOSFET that does not have the built-in SBD. Further, the trench-side-wall SBD is disposed along the second side wall of the trench, whereby no channel is formed along the second side wall of the trench and therefore, current characteristics do not become unbalanced between the side walls of the trench.

Further, according to the first embodiment, the trench-side-wall SBD is disposed along the second side wall of the trench, whereby when the pn junctions between the p-type base region, the p$^+$-type region (the p$^+$-type region encompassing the bottom corner portion at the second side wall of the trench) and the n$^-$-type drift region and the pn junctions between the p-type base region, the p$^+$-type region (the p$^+$-type region encompassing the bottom corner portion at the second side wall of the trench) and the n-type current spreading region 3 are forward biased, and electron current flows in the trench-side-wall SBD. Therefore, parasitic pn diodes formed by these pn junctions do not operate. Accordingly, forward degradation due to forward operation of the parasitic pn diodes may be prevented.

Further, according to the first embodiment, when the MOSFET is OFF, electric field applied to the trench-side-wall SBD at the bottom corner portion at the second side wall of the trench is suppressed by a depletion layer that spreads in the p$^+$-type region that encompasses the bottom corner portion at the second side wall of the trench.

Figure 9:
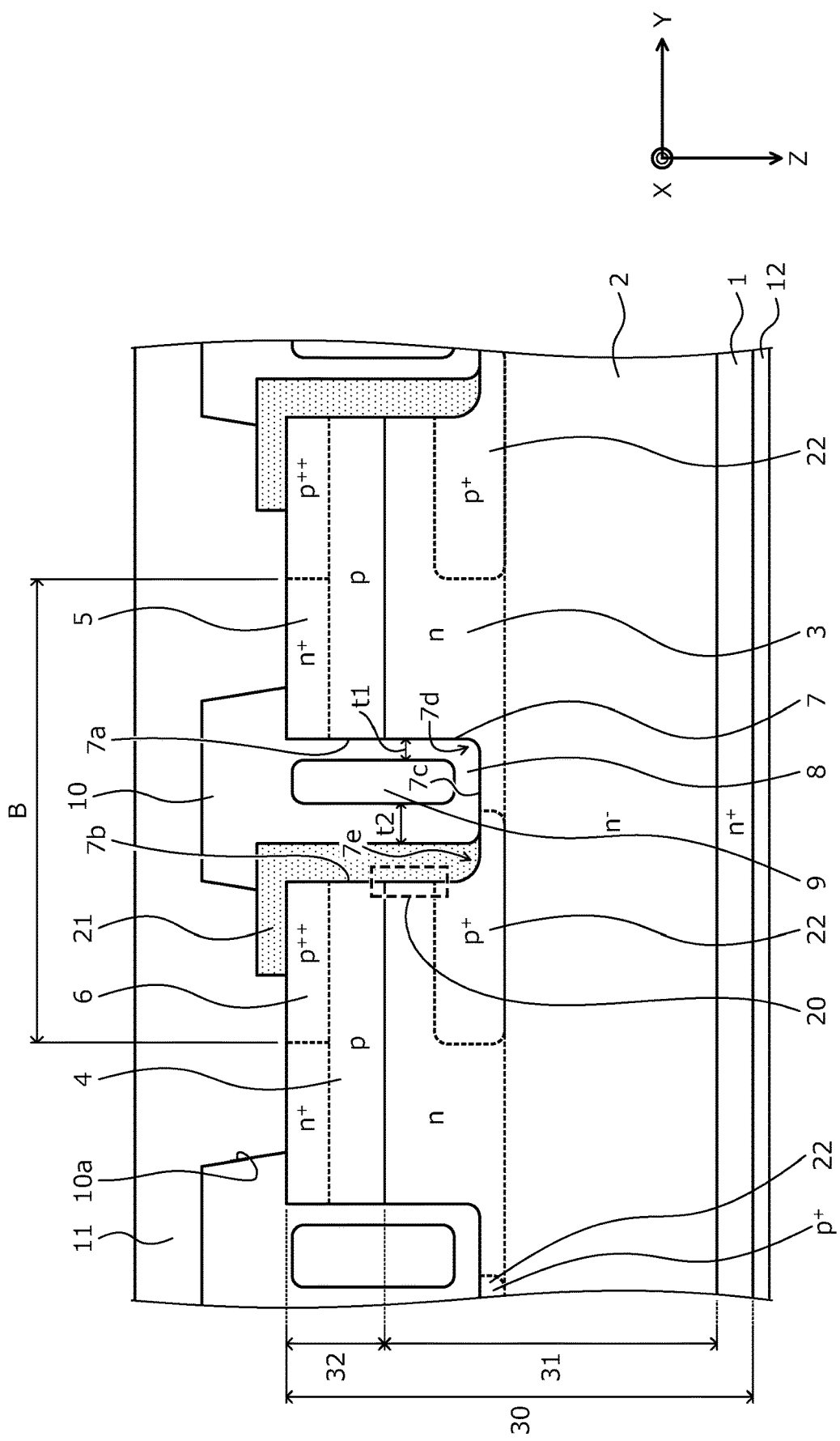
FIG. 9 is a cross-sectional view of a structure of the semiconductor device according to a second embodiment.

A structure of the semiconductor device according to a second embodiment will be described. FIG. 9 is a cross-sectional view of the structure of the semiconductor device according to the second embodiment. The semiconductor device according to the second embodiment differs from the semiconductor device according to the first embodiment in that a thickness t2 of a portion of the gate insulating film 8 between the gate electrode 9 and the conductive layer 21 is thicker than a thickness t1 of a portion along the first side wall 7a of the trench 7.

A method of manufacturing the semiconductor device according to the second embodiment includes in the method of manufacturing the semiconductor device according to the first embodiment, depositing the poly-silicon layer as the conductive layer 21, etching the poly-silicon layer so the poly-silicon layer remains on the second side wall 7b of the trench 7, and thereafter, oxidizing a surface of the conductive layer 21 (the surface of the conductive layer 21 on the side in contact with the gate insulating film 8) to be a portion of the gate insulating film 8.

As described above, according to the second embodiment, effects similar to those of the first embodiment may be obtained. Further, according to the second embodiment, the thickness of the portion of the gate insulating film between the gate electrode and the conductive layer is increased, whereby insulation of the conductive layer constituting the trench-side-wall SBD and of the gate electrode of the MOSFET increases, enabling the reliability to be enhanced.

Figure 10:
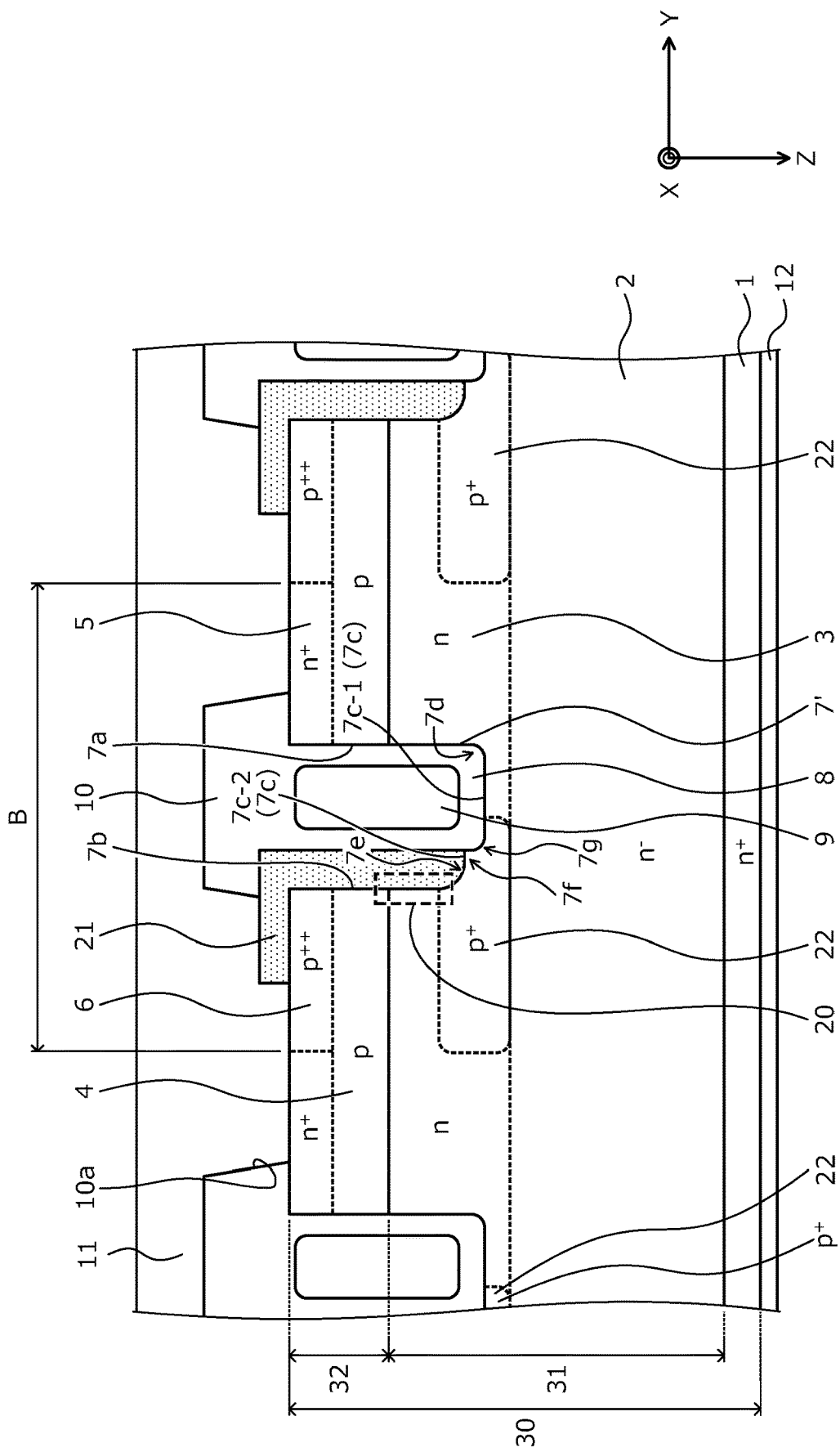
FIG. 10 is a cross-sectional view of a structure of the semiconductor device according to a third embodiment.

A structure of the semiconductor device according to a third embodiment will be described. FIG. 10 is a cross-sectional view of the structure of the semiconductor device according to the third embodiment. The semiconductor device according to the third embodiment differs from the semiconductor device according to the first embodiment in that at the bottom 7c of a trench 7', a step 7f is provided such that a bottom 7c-1 nearest the first side wall 7a is deeper than a bottom 7c-2 nearest the second side wall 7b.

A method of manufacturing the semiconductor device according to the third embodiment includes in the method of manufacturing the semiconductor device according to the first embodiment, further etching (over-etching of the conductive layer 21) a silicon portion of the bottom 7c-1 nearest the first side wall 7a of the trench 7' together with the conductive layer 21 during the etching for patterning the conductive layer 21, whereby the semiconductor device is fabricated (manufactured). The $p^+$-type region 22 underlies the step 7f formed at the bottom 7c of the trench 7' by over-etching of the conductive layer 21.

In other words, the $p^+$-type region 22 encompasses the bottom corner portion 7e at the second side wall 7b of the trench 7', and a bottom corner portion 7g formed at the bottom 7c of the trench 7' by the step 7f. The bottom corner portion 7g formed at the bottom 7c of the trench 7' by the step 7f is a boundary between a stair (a connection portion between the bottom 7c-1 nearest the first side wall 7a and the bottom 7c-2 nearest the second side wall 7b of the trench 7') of the step 7f and the bottom 7c-1 nearest the first side wall 7a of the trench 7'.

The third embodiment may be applied to the second embodiment (not depicted).

As described above, according to the third embodiment, during the etching for patterning the conductive layer 21, even when the conductive layer 21 is over-etched, effects similar to those of the first and the second embodiments may be obtained.

Figure 11:
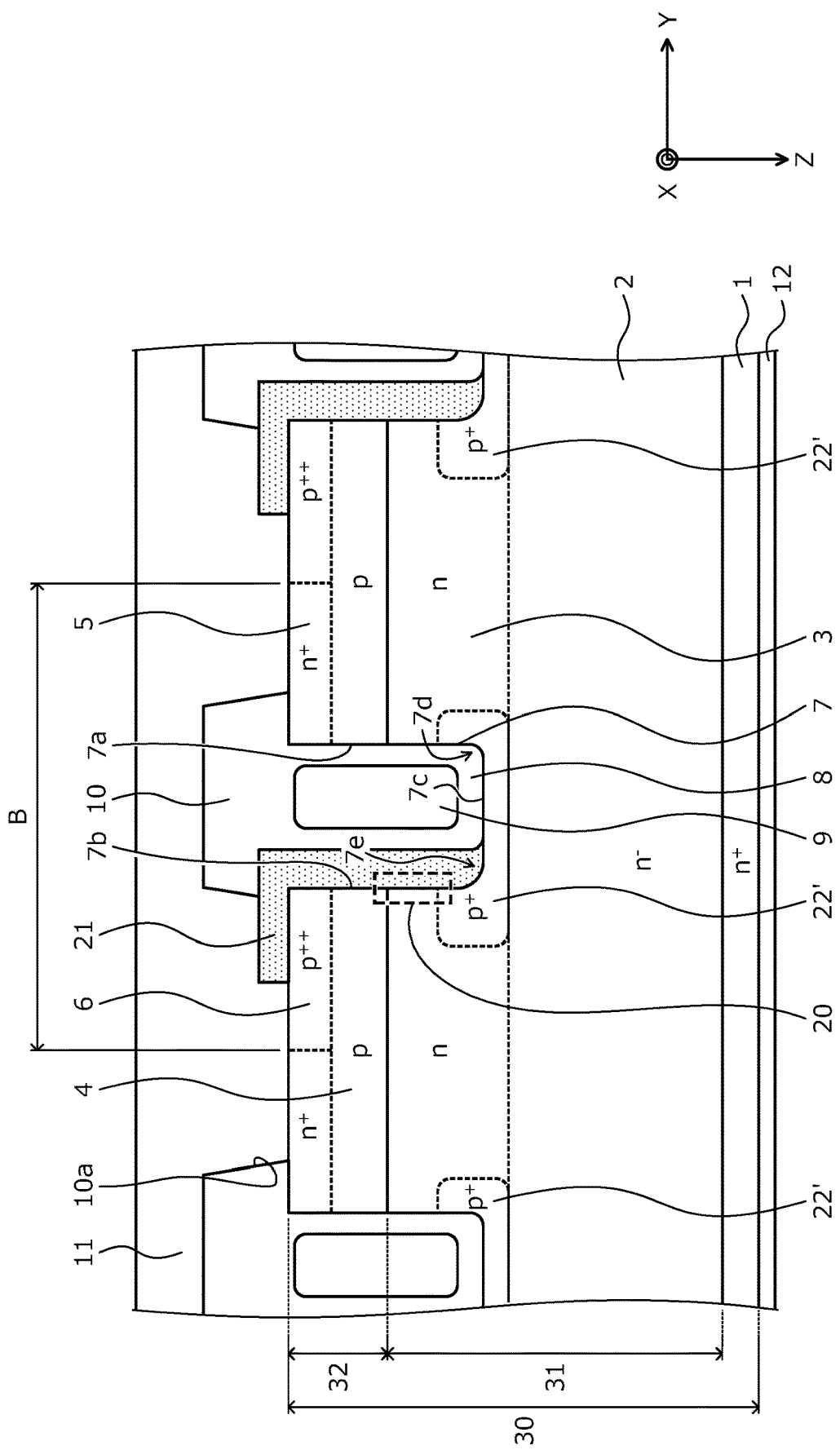
FIG. 11 is a cross-sectional view of a structure of the semiconductor device according to a fourth embodiment.
Figure 12:
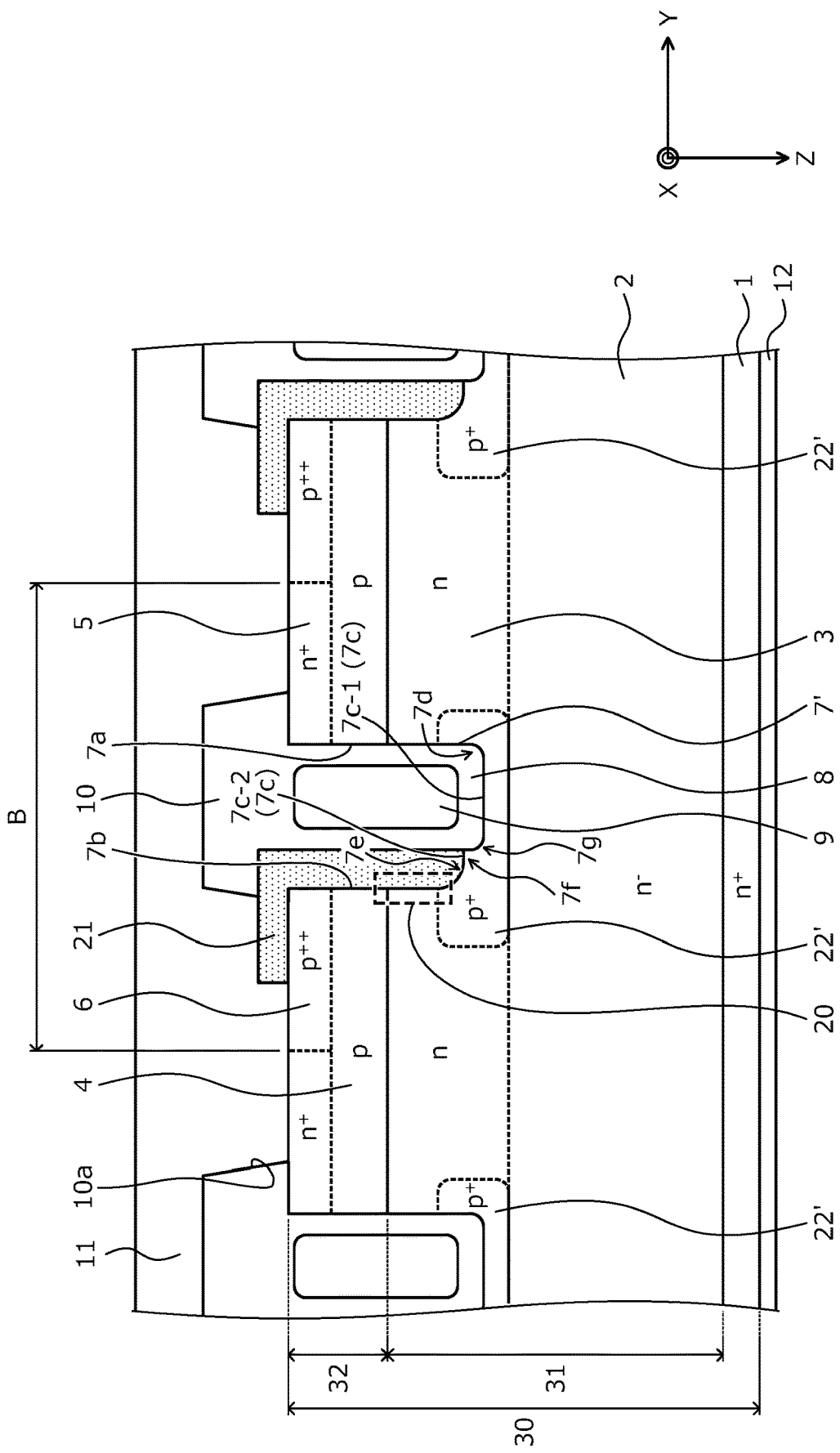
FIG. 12 is a cross-sectional view of another example of the structure of the semiconductor device according to the fourth embodiment.

A structure of the semiconductor device according to a fourth embodiment will be described. FIG. 11 is a cross-sectional view of the structure of the semiconductor device according to the fourth embodiment. FIG. 12 is a cross-sectional view of another example of the structure of the semiconductor device according to the fourth embodiment. The semiconductor device according to the fourth embodiment differs from the semiconductor device according to the first embodiment in that the bottom corner portions 7d, 7e of the trench 7 are encompassed by a $p^+$-type region 22' (refer to FIG. 11).

A method of manufacturing the semiconductor device according to the fourth embodiment includes in the method of manufacturing the semiconductor device according to the first embodiment, disposing the $p^+$-type region 22' at a position so as to encompass the bottom corner portions 7d, 7e of the trench 7, when the $p^+$-type region 22' is formed in the $n^-$-type silicon carbide layer 31. By disposing the $p^+$-type region 22' in this manner, when the MOSFET is OFF, electric field applied to the bottom corner portions 7d, 7e of the trench 7 may be mitigated.

Further, by disposing the $p^+$-type region 22' in this manner, even when positioning deviates in the second direction Y during alignment (positioning) during the formation of the trench 7 and/or the $p^+$-type region 22, the bottom corner portion 7e at the second side wall 7b of the trench 7 may be prevented from being positioned outside the $p^+$-type region 22' (i.e., from being positioned in the n-type current spreading region 3).

The fourth embodiment may be applied to the third embodiment (refer to the other example of the semiconductor device according to the fourth embodiment depicted in FIG. 12). Further, the second embodiment may be applied to the fourth embodiment, and the thickness of the portion of the gate insulating film 8 between the gate electrode 9 and the conductive layer 21 may be increased to be thicker than the thickness of the portion on the first side wall 7a of the trench 7 (not depicted).

As described above, according to the fourth embodiment, even in the structure in which both of the bottom corner portions of the trench 7 are encompassed by the $p^+$-type region, effects similar to those of the first to the third embodiments may be obtained. Further, according to the fourth embodiment, when the MOSFET is OFF, the electric field applied to the gate insulating film at the bottom corner portion at the first side wall of the trench and the electric field applied to the trench-side-wall SBD at the bottom corner portion at the second side wall of the trench are suppressed by the depletion layer that spreads in the $p^+$-type region that encompasses both of the bottom corner portions of the trench. Therefore, an effect of further suppressing electric field is obtained.

Figure 13:
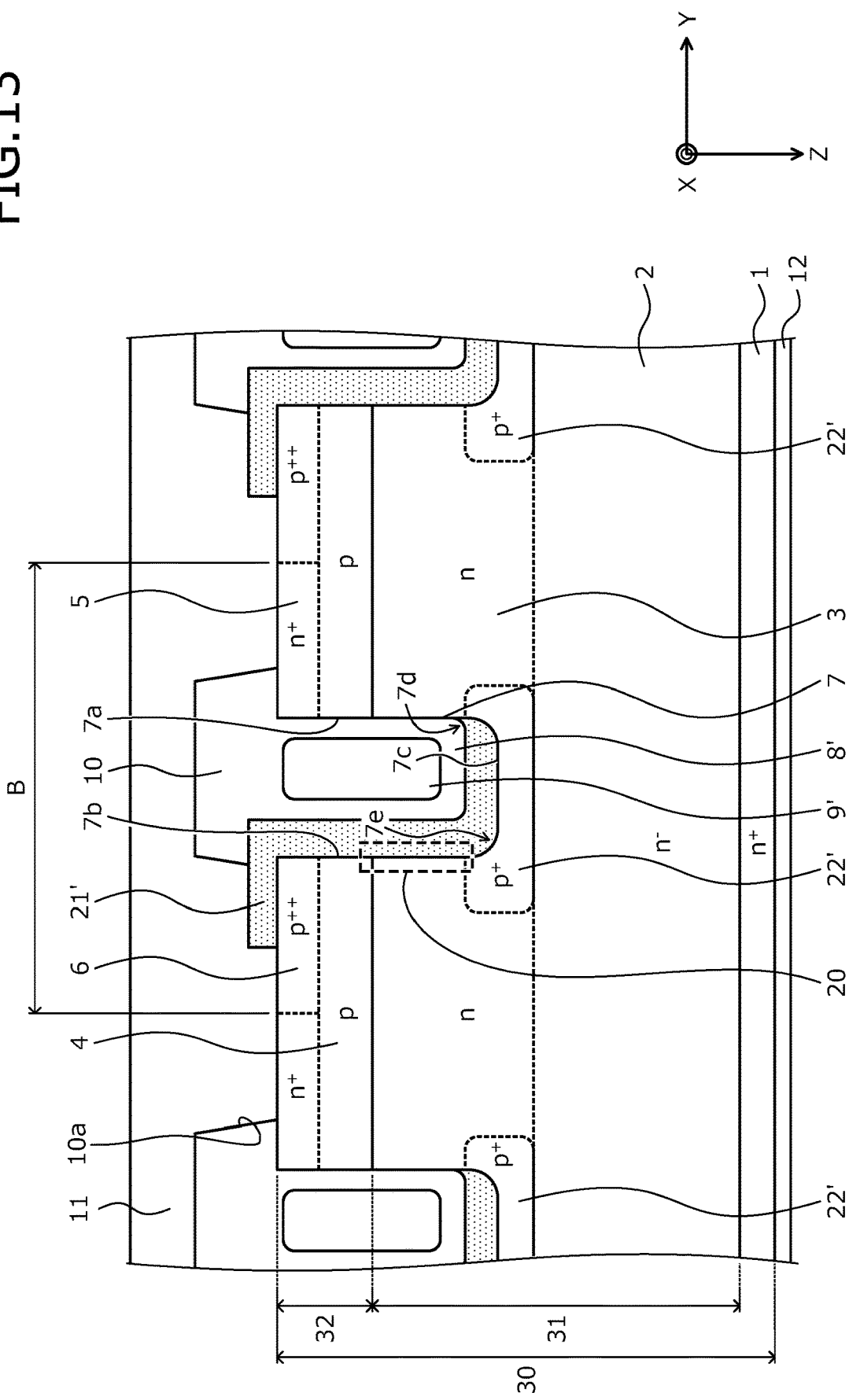
FIG. 13 is a cross-sectional view of a structure of the semiconductor device according to a fifth embodiment.

A structure of the semiconductor device according to a fifth embodiment will be described. FIG. 13 is a cross-sectional view of the structure of the semiconductor device according to the fifth embodiment. The semiconductor device according to the fifth embodiment differs from the semiconductor device according to the fourth embodiment depicted in FIG. 11 in that the conductive layer 21' constituting the trench-side-wall SBD 20 is provided along the second side wall 7b of the trench 7 and the bottom 7c, spanning from the second side wall 7b of the trench 7 to the bottom corner portion 7d at the first side wall 7a. In other words, the conductive layer 21' extends between the bottom 7c of the trench 7 and the gate insulating film 8', from the second side wall 7b of the trench 7.

In particular, similarly to the fourth embodiment, the conductive layer 21' is in contact with the $p^{++}$-type contact region 6, the p-type base region 4, the n-type current spreading region 3, and the $p^+$-type region 22', at the second side wall 7b of the trench 7. The conductive layer 21', similarly to the fourth embodiment, extends on the front surface of the semiconductor substrate 30 from the second side wall 7b of the trench 7 so as to cover a portion of the $p^{++}$-type contact region 6. Additionally, the conductive layer 21' is in contact with the $p^+$-type region 22' at the bottom 7c of the trench 7.

From the first side wall 7a of the trench 7, the gate insulating film 8' is provided along surfaces of the conductive layer 21' (the surfaces on the sides opposite those facing toward the second side wall 7b of the trench 7 and the bottom 7c). In the trench 7, the gate electrode 9' is provided on the gate insulating film 8', similarly to the fourth embodiment. The gate electrode 9' opposes the n-type current spreading region 3 across the gate insulating film 8', at the first side wall 7a of the trench 7.

The fifth embodiment may be applied to the other example of the semiconductor device according to the fourth embodiment (refer to FIG. 12). Further, the second embodiment may be applied to the fifth embodiment, and the thickness of the portion of the gate insulating film 8 between the gate electrode 9 and the conductive layer 21' may be increased to be thicker than the thickness of the portion on the first side wall 7a of the trench 7 (not depicted).

As described above, according to the fifth embodiment, even when the conductive layer constituting the trench-sidewall SBD is extended to the bottom of trench, effects similar to those of the first to the fourth embodiments may be obtained.

In the foregoing, without limitation to the embodiments described, various modifications are possible within a range not departing from the spirit of the invention. For example, instead of the conductive layer disposed along the second side wall of the trench, a semiconductor layer (electrode layer) having a bandgap different from that of a silicon carbide portion (n-type current spreading region) exposed at the second side wall of the trench may be provided, and a semiconductor element may be formed by a heterojunction between the semiconductor layer and the silicon carbide portion. Further, even when a wide bandgap semiconductor material other than silicon carbide (for example, gallium (Ga) or the like) is applied to the present invention, similar effects are achieved. The present invention is similarly implemented when conductivity types (n-type, p-type) are reversed.

The semiconductor device according to the present invention achieves an effect in that a semiconductor device may be provided that is a trench gate MOSFET in which a SBD is built-in on the same semiconductor substrate, and without current characteristics becoming unbalanced, a channel is formed along a (112-0) plane having high carrier mobility, and ON resistance is reduced.

As described, the semiconductor device according to the present invention is useful for a MOS semiconductor device having a trench gate structure in which a flat SBD is built-in on the same semiconductor substrate.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
    a semiconductor substrate containing a semiconductor material having a bandgap that is wider than a bandgap of silicon;
    a first semiconductor layer of a first conductivity type and provided on a front surface of the semiconductor substrate, the first semiconductor layer containing the semiconductor material having the bandgap that is wider than the bandgap of silicon;
    a second semiconductor layer of a second conductivity type and provided on a first side of the first semiconductor layer, the second semiconductor layer containing the semiconductor material having the bandgap that is wider than the bandgap of silicon, the first side of the first semiconductor layer being opposite a second side of the first semiconductor layer, the second side facing toward the semiconductor substrate;
    a first semiconductor region of the first conductivity type and selectively provided in the second semiconductor layer;
    a second semiconductor region of the second conductivity type and selectively provided in the second semiconductor layer, the second semiconductor region being in contact with the first semiconductor region along a direction parallel to the front surface of the semiconductor substrate and having an impurity concentration that is higher than an impurity concentration of the second semiconductor layer;
    a third semiconductor region of the second conductivity type, the third semiconductor region being a portion of the second semiconductor layer other than the first semiconductor region and the second semiconductor region, and disposed closer to the semiconductor substrate than are the first semiconductor region and the second semiconductor region;
    a trench penetrating the first semiconductor region, the second semiconductor region, and the third semiconductor region, at a boundary between the first semiconductor region and the second semiconductor region, the trench reaching the first semiconductor layer;
    a gate insulating film provided along a bottom and a first side wall of the trench;
    a gate electrode provided at a surface of the first side wall of the trench, via the gate insulating film, and opposing a portion of the third semiconductor region between the first semiconductor region and the first semiconductor layer;
    an electrode layer provided along a second side wall of the trench and at the second side wall of the trench, forming a Schottky contact or a heterocontact with the second semiconductor region, the third semiconductor region, and the first semiconductor layer;
    a fourth semiconductor region of the second conductivity type and provided in the first semiconductor layer so as to be separated from the third semiconductor region and encompass a corner formed by the bottom and the second side wall of the trench;
    a first electrode electrically connected to the first semiconductor region, the second semiconductor region, the fourth semiconductor region, and the electrode layer; and
    a second electrode provided at a rear surface of the semiconductor substrate.

2. The semiconductor device according to claim 1, wherein
    the gate insulating film extends between the gate electrode and the electrode layer, and electrically insulates the gate electrode and the electrode layer.

3. The semiconductor device according to claim 1, wherein
    a thickness of a portion of the gate insulating film between the gate electrode and the electrode layer is greater than a thickness of a portion of the gate insulating film along the first side wall of the trench.

4. The semiconductor device according to claim 1, wherein
    the bottom of the trench has a step where the bottom near the first side wall is deeper than the bottom near the second side wall, and
    the fourth semiconductor region encompasses a corner formed by the bottom near the first side wall of the trench and a connection portion that is between the bottom near the first side wall of the trench and the bottom near second side wall.

5. The semiconductor device according to claim 1, wherein
    the fourth semiconductor region encompasses a corner formed by the bottom and the first side wall of the trench, and underlies the bottom of the trench from the corner formed by the bottom and the second side wall of the trench, to the corner formed by the bottom and the first side wall of the trench.

6. The semiconductor device according to claim 5, wherein the electrode layer extends between the bottom of the trench and the gate insulating film, from the second side wall of the trench.

\* \* \* \* \*